United States Patent [19]

Tsai et al.

[11] Patent Number: 5,688,608
[45] Date of Patent: Nov. 18, 1997

[54] HIGH REFRACTIVE-INDEX IR TRANSPARENT WINDOW WITH HARD, DURABLE AND ANTIREFLECTIVE COATING

[75] Inventors: Rung-Ywan Tsai, Kaohsiung; Fang Chuan Ho, Hsinchu, both of Taiwan

[73] Assignee: Industrial Technology Research Institute, Hsinchu, Taiwan

[21] Appl. No.: 459,475

[22] Filed: Jun. 2, 1995

Related U.S. Application Data

[63] Continuation-in-part of Ser. No. 194,572, Feb. 10, 1994, abandoned.

[51] Int. Cl.$^6$ .................................................. B32B 15/00
[52] U.S. Cl. ...................... 428/696; 428/697; 428/701; 428/702; 428/432; 428/336; 359/359; 359/360; 359/585; 359/586; 359/588
[58] Field of Search .................. 430/5, 321; 428/689, 428/696, 697, 701, 702, 432, 336; 359/359, 360, 585, 586, 588

[56] References Cited

U.S. PATENT DOCUMENTS

| | | |
|---|---|---|
| 3,775,161 | 11/1973 | Martyny .................................. 428/432 |
| 3,829,197 | 8/1974 | Thelen .................................... 359/360 |
| 4,161,547 | 7/1979 | Kienel .................................... 428/432 |
| 4,161,560 | 7/1979 | Kienel .................................... 428/432 |
| 4,260,222 | 4/1981 | Kozawa ................................. 428/432 |
| 4,590,128 | 5/1986 | Kawai .................................... 428/432 |
| 4,799,745 | 1/1989 | Meyer .................................... 359/588 |
| 5,183,700 | 2/1993 | Austin .................................... 428/432 |
| 5,268,217 | 12/1993 | Kimock ................................. 428/432 |

OTHER PUBLICATIONS

"Glass Engineering Handbook", McGraw–Hill (1958), pp. 17–18.

Primary Examiner—Ellis Robinson
Assistant Examiner—Timothy M. Speer
Attorney, Agent, or Firm—W. Wayne Liauh

[57] ABSTRACT

A hard and durable single-layer or multilayer artireflection coating for use with a high refractive-index IR transparent substrate is provided. The coating is prepared by concurrent deposition of $TiO_2$ and $MgF_2$ with the reactive ion-assistance on the IR transparent substrate within a single vacuum chamber. The refractive-index of this film is adjustable by varying the relative deposition rate of the two materials (i.e. controlling the ratio of the materials) to optimize the transmittance of the incident IR irradiation. The opitical thickness of each film of the single-layer and multilayer antireflection coatings is one-quarter wavelength of the IR irradiation.

8 Claims, 7 Drawing Sheets

TiO2-MgF2

IR transmitting substrate

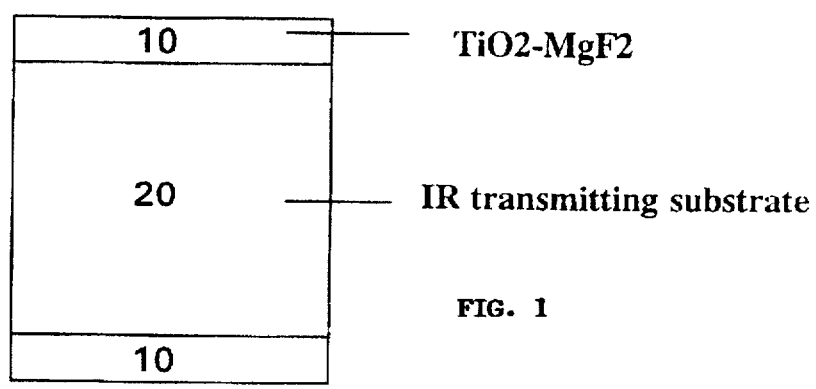
FIG. 1
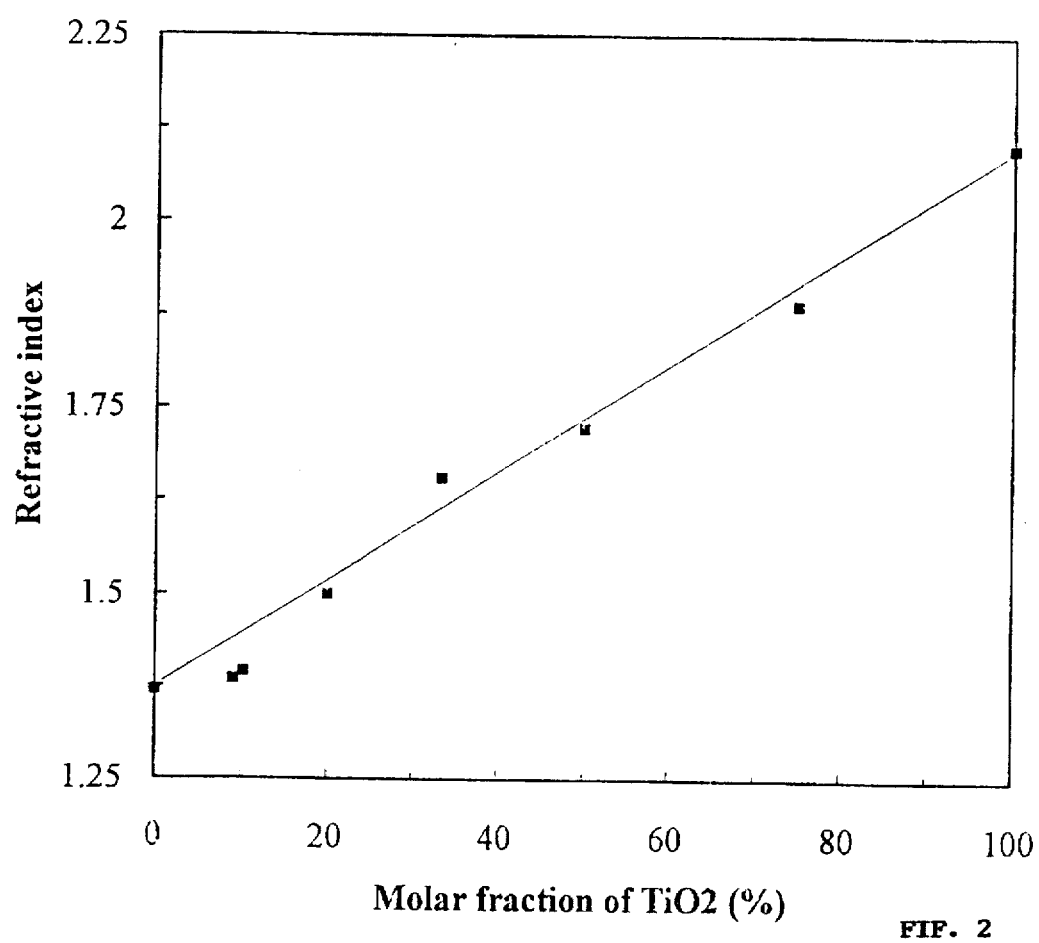
FIF. 2

HIGH REFRACTIVE-INDEX IR TRANSPARENT WINDOW WITH HARD, DURABLE AND ANTIREFLECTIVE COATING

This application is a continuation-in-part of application Ser. No. 08/194,572, filed Feb. 10, 1994, now abandoned. This application relates to infrared (IR) windows, in particular to coating of IR transparent substrate.

BACKGROUND OF THE INVENTION

This application relates to optical materials for infrared transmission.

Most devices transparent to infrared (IR) irradiation, such as IR windows, utilize high refractive-index (n) materials, e.g. gallium arsenide ($n_2$=3.34 at wavelength ($\lambda$=2 µm) and germanium ($n_2$=4.116 at $\lambda$=2 µm). However, most high refractive-index materials have high surface reflectance. To improve the IR transmittance of such high refractive-index materials, it is necessary to coat the device with antireflection (AR) coating. A single-layer coating is the simplest, both theoretically and experimentally, and is widely used in practice. The thickness of the ideal single-layer AR coating should be equal to one-quarter wavelength of the IR irradiation, and the refractive-index of the coating ($n_1$) should be equal the square-root of the product of the refractive-indices of the IR transparent material ($n_2$) and the incident medium ($n_0$). When the irradiation source is incident normally from the air to the IR window, the reflection from the interface between the air and AR coating may subtractively interfere with the reflection from interface beween the AR coating and the IR transparent material, resulting in zero reflectance. For the silicon substrate, the refractive-index $n_2$=3.62 at a wavelength $\lambda$=1.06 µm. The reflectance R for normal incidenace from a single surface of the silicon substrate is given as:

$$R = [(n_0 - n_2)/(n_0 - n_2)]^2$$
$$= [(1 - 3.62)/(1 + 3.62)]^2$$
$$= 32.1\%$$

Since there are two surfaces of the silicon material, the incident irradiation suffers a loss as high as 54%. Such a loss reduces the transmittance of the incident irradiation. When the device is deposited with an optical film with a refractive-index of 1.9 and a thickness of $\lambda$/4 or any odd multiple of $\lambda$/4 at $\lambda$=1.06 µm, then the reflectance drops from 54% to zero at $\lambda$=1.06 µm, i.e. the transmittance is 100%.

The commonly used antireflection coating materials, such as ZnS ($n_1$=2.266 at $\lambda$=2 µm), TiO$_2$ ($n_1$=2.43 at $\lambda$=2 µm), CeO$_2$ ($n_1$=2.3 at $\lambda$=2 µm), Ta$_2$O$_5$ ($n_1$=2.1 at $\lambda$=2 µm), ZrO$_2$ ($n_1$=2.3 at $\lambda$=2 µm) all have fixed refractive-indices. They cannot satisfy the requirement of ideal single-layer AR coating for various IR transparent materials, and often combine with other materials of different refractive-indices to form multilayer AR coatings, as disclosed in U.S. Pat. Nos. 4,436,464 and 4,260,222. Although the antireflection range is wider for multilayer coatings, the designs and fabrications are more complicated and time consuming. For any particular wavelength, the transmittance of multilayer AR coating may not be as high as a single-layer AR coating.

In practice, particularly for military applications, it is necessary not only to have high transmittance but also to withstand harsh ambient conditions, such as mechanical stress, weather and temperature variations. Therefore, the IR transparent material must possess durability and stability.

Most IR transparent materials have inferior mechanical strength and ambient stability to adversely limit their useful lives. It is often necessary to add another protective layer to extend their useful lives.

In U.S. Pat. No. 3,775,161, Martyny disclosed a MgF$_2$—TiO$_2$ coating with a TiO$_2$ molar fraction ranging from 58.3% to 93.3% for protecting a lamp, but did not disclose an antireflective coating for IR detectors. In U.S. Pat. No. 4,260,222, Kozawa disclosed a pure MgF$_2$ antireflective coating for visible light, but the coating is seldom used for IR, because it exhibits extremely high tensile stress and is easy to crack and peeling at larger thickness, hence never used for IR antireflective coating. In U.S. Pat. No. 4,436,363, Steinbruegge disclosed a complicated antireflection multilayer coating comprising a first thin film layer selected from the group consisting of zinc-selenide and zinc sulfide, a second thin film layer selected from the the group consisting of lead-fluoride and aluminum oxide and a third thin film layer selected from the group consisting of magnesium-fluoride, barium-fluoride and calcium-fluoride for IR lens.

SUMMARY

An object of the present invention is to provide a coating on the basis of TiO$_2$ and MgF$_2$ mixing which can be used as a single-layer or multilayer AR coating for high refractive-index IR transparent materials to enhance the transmittance.

Another object of this invention is to provide a coating on the basis of TiO$_2$ and MgF$_2$ mixing with an adjustable refractive-index, which can be used as single-layer or multilayer AR coatings for transmission of optical signals in the 0.4-8 µm range.

Still another object of the present invention is to provide a hard and durable coating, which can be used as single-layer or multilayer AR coatings for high refractive-index IR transparent materials to improve the useful life.

These objects are achieved by using a composite titanium oxide-magnesium fluoride (TiO$_2$—MgF$_2$) material, prepared by reactive ion-assisted deposition (IAD), as AR coatings for high refractive-index IR transparent windows. Such a composite material posesses the following features:

(1) The refractive-index can be adjusted by controlling the composition of the composite film, varying from $n_1$=2.1 (at $\lambda$=1.06 µm) for pure TiO$_2$ to $n_1$=1.37 (at $\lambda$=1.06 µm) for pure MgF$_2$. Thus, by controlling the composition of the composite films, the composite material can be used as single-layer or multilayer AR coatings for various IR transparent windows with refractive-indices $n_2$ ranging from 1.88 to 4.41 (at $\lambda$=1.06 µm). The composition of the composite films can be achieved by controlling the relative deposition rate of TiO$_2$ and MgF$_2$.

(2) The transmittance range of the composite TiO$_2$—MgF$_2$ film is from 0.4 to 8 µm.

(3) The hardness of the TiO$_2$—MgF$_2$ film prepared by the reactive IAD is much harder than that obtained with the conventional reactive coevaporation at the substrate temperature 280° C. For the film with a molar fraction of TiO$_2$ larger than 40%, the hardness is higher than that of glass and pure TiO$_2$. The composite films also have durability to protect against erosion due to ambient conditions, and is very suitable for IR transparent windows as a protecting layer.

BRIEF DESCRIPTION OF THE DRAWINGS

FIG. 1 shows the cross-section view of a single-layer AR coating of composite TiO$_2$—MgF$_2$ film on an IR transparent substrate based on the present invention.

FIG. 2 shows the variation of refractive-indices of composite TiO$_2$—MgF$_2$ films as a function of molar fraction of TiO$_2$.

DETAILED DESCRIPTION OF THE PREFERRED EMBODIMENT

FIG. 1 shows the basic structure of an IR transparent window of the present invention. An IR transparent substrate 20 is deposited with a layer of a composite TiO$_2$—MgF$_2$ film 10. This film 10 has a thickness equal to one-quarter wavelength of the transmitting IR irradiation. The composition of the film depends on the substrate material.

The composite TiO$_2$—MgF$_2$ film of this invention is prepared by reactive IAD on the high refractive-index IR transparent substrate. The starting materials are Ti$_2$O$_3$ and MgF$_2$. Both materials are evaporated simultaneously by two electron-beam sources with individual beam current and sweep controls. Two quartz crystal monitors are used to control the deposition rate. The deposition rate for TiO$_2$ is 0.2 nm/S, and the deposition rate for the MgF$_2$ is varied to achieve the desired film composition. The thickness of the deposited films is controlled in-situ by a third quartz oscillator, which is placed near the substrate and faces the two evaporation sources. The substrate temperature is maintained lower than 40° C. The reaction gas is a mixture of pure argon and pure oxygen. The partial pressures are respectively 1.8×10$^{-4}$ and 1.2×10$^{-4}$ mbar. Pure argon is fed from the bottom of an ion gun to be ionized. Mixed gas of argon and oxygen is fed from the outlet of the ion gun. Experiments have proven that pure oxygen can also be completely ionized.

TiO$_2$ and MgF$_2$ have good adhesion and stable characteristics, capable of resisting mechanical scratching, chemical erosion and high temperature. They are widely used as thin-film deposition materials. The transmission ranges of TiO$_2$ and MgF$_2$ are respectively 0.4–10 µm and 0.23–8 µm. Experimental results have demonstrated the optical properties of composite TiO$_2$—MgF$_2$ film prepared by reactive IAD vary with composition. The optical characteristic changes from a MgF$_2$-dominant one to a TiO$_2$-dominant one with increasing molar fraction of TiO$_2$. Thus, in the 0.4 to 8 µm wavelength range, the composite TiO$_2$—MgF$_2$ film is totally transmissive.

FIG. 2 shows the variation of the refractive-index of the composite TiO$_2$—MgF$_2$ film as a function of the composition. The refractive-indices lie between that of pure MgF$_2$ (n=1.37 at λ=1.06 µm) and pure TiO$_2$ (n=2.1 at λ=1.06 µm). Therefore, any particular refractive-index can be obtained with an appropriate composition. Based on the requirement of a single-layer AR coating, the composite TiO$_2$—MgF$_2$ can be used as an antireflection layer on materials with refractive-indices lying in the range of 1.88–4.41 at λ=1.06 µm. Similarly, composite TiO$_2$—MgF$_2$ films can also be used as multilayer AR coating. They are applicable to both visible light and IR irradiation with wavelength in the 0.8–8 µm range.

Figure 3:
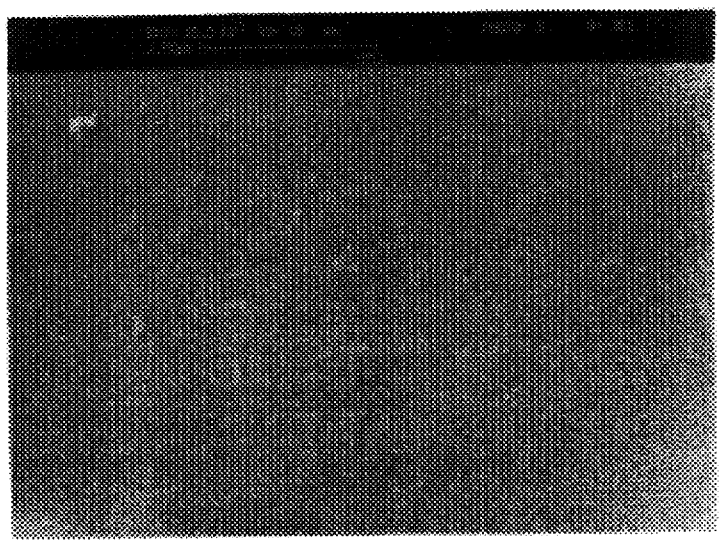
FIG. 3 shows a SEM micrograph of the surface morphology of a composite TiO$_2$—MgF$_2$ film containing 50 at % TiO$_2$.

In addition, the composite TiO$_2$—MgF$_2$ film prepared by reactive IAD has a very smooth surface without any pronounced granular features. FIG. 3 shows the surface morphology of a film with 50% molar fraction of TiO$_2$ taken with a scanning electron microscope at a magnification of 20000 times. The micrograph shows a feature size smaller than 0.1 um, which is much shorter than the wavelengths of visible light. Therefore, the scattering of visible light and IR is very small and does not affect the transmittance of incident light.

Figure 4:
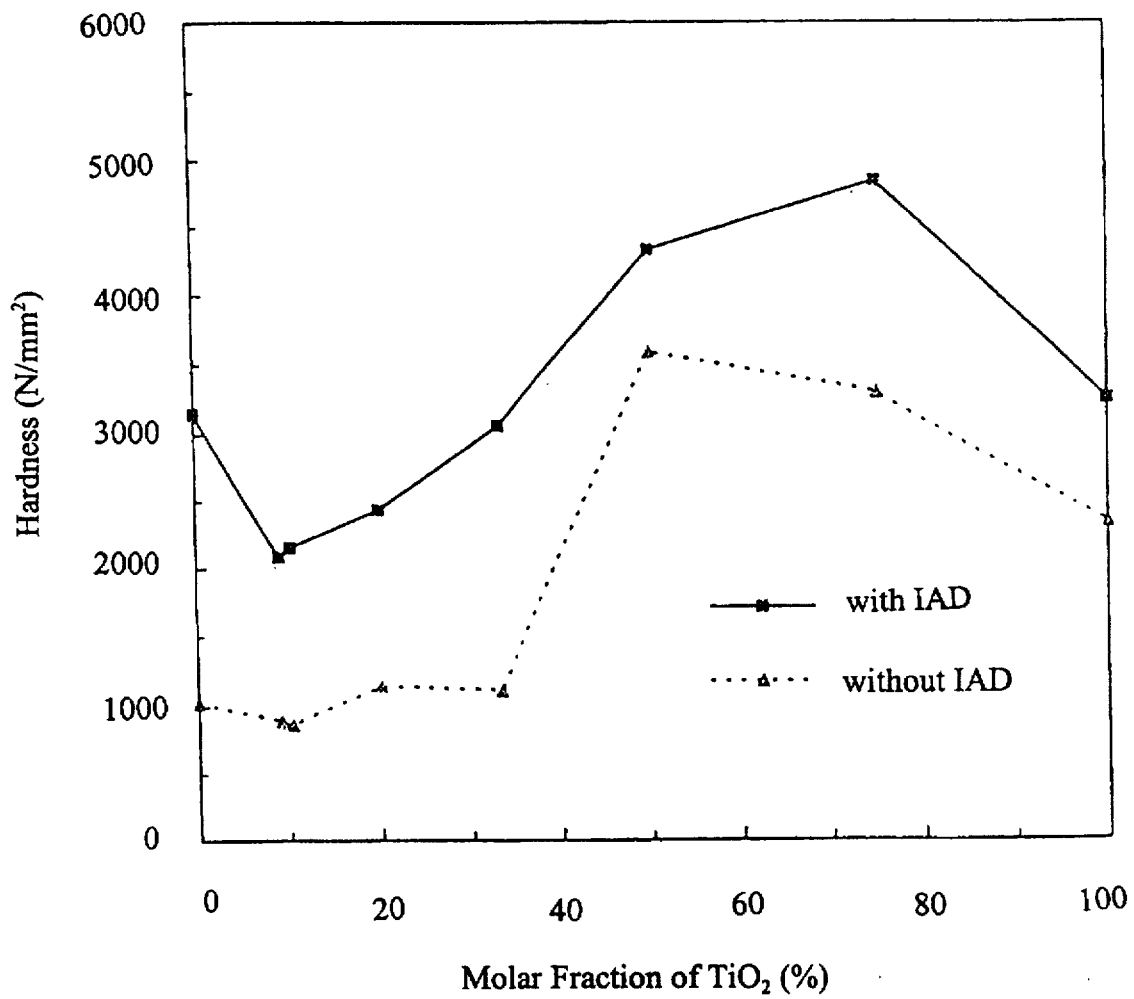
FIG. 4 shows the variation of microhardness against compositions of composite TiO$_2$—MgF$_2$ films with and without reactive IAD.

In many high quality engineering applications (e.g. military usage), there are other requirements in addition to optical properties which are important. Among the important requirements, hardness is a material characteristic which is essential to many advanced optical coating applications. The measurement of hardness is a simple but useful technique for characterizing mechanical properties. The harder the film, the more resistant to scratching and impact. The microhardness of the TiO$_2$—MgF$_2$ films has been measured by indenting the samples with a diamond tip and dividing the applied load (0.4–200 mN) by the contact area of the stylus at the measured penetration depth. For a thickness in the range of 0.6–1.5 µm, the value of hardness is almost constant. FIG. 4 shows the variation of hardness of the composite TiO$_2$—MgF$_2$ films prepared by reactive IAD as a function of TiO$_2$ content. The values of hardness of these films are obtained at the penetration depth of 0.8 µm. It is observed that the microhardness of the mixed films depends nonlinearly on composition in this system. The hardness of pure MgF$_2$ and pure TiO$_2$ are 3150 and 3320 N/mm$^2$, respectively, which are lower than the hardness of glass at 3600 N/mm$^2$. When the molar fraction of TiO$_2$ is 9.3%, the hardness of the composite film is less than that of pure MgF$_2$. As the molar fraction of TiO$_2$ is higher than 33.3%, the hardness of the composure film exceeds those of pure TiO$_2$ and glass. As shown in FIG. 4, when the molar fraction of TiO$_2$ increases to 75%, the hardness reaches 4900 N/mm$^2$. The adhesion strength of the film to the IR transparent substrate is sufficiently strong and no failure occurs using the adhesive tape peel off test. The trend of increasing and decreasing hardness for the TiO$_2$—MgF$_2$ films prepared by conventional reactive co-evaporation at a subtrate temperature 280° C. is similar to that shown in FIG. 4, although the hardness is much lower than that prepared by reactive IAD. Thus, the TiO$_2$—MgF$_2$ composite films prepared by reactive IAD can not only be used for antireflection purposes property but also be used as a protective film.

Figure 5:
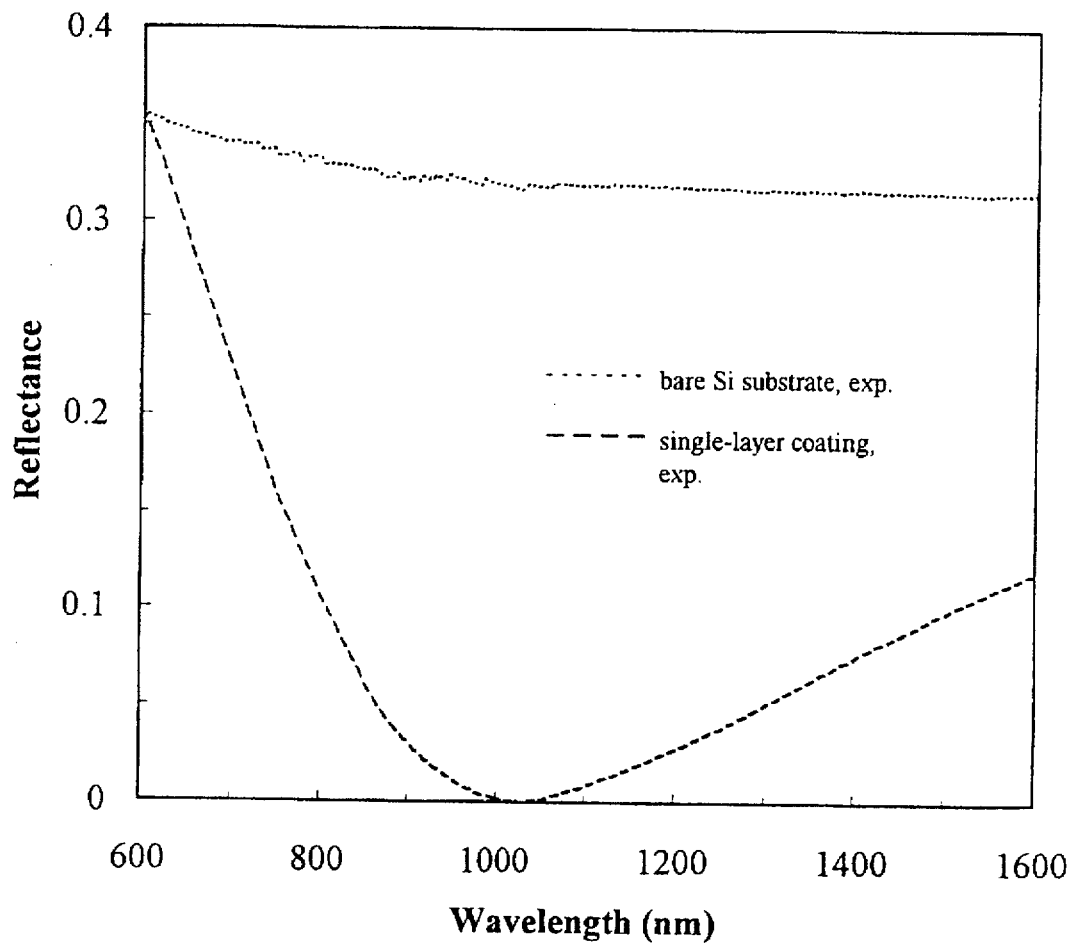
FIG. 5 shows the measured reflectance of a Si wafer coated and not coated with a single-layer AR coating.

An actual example can illustrate the application of a single-layer TiO$_2$—MgF$_2$ film for antireflection purpose. The incident light source is a Nd:YAG laser with a wavelength of 1.06 µm. For ideal single-layer AR coating requirements on a Si wafer, the refractive index of the coating material should be 1.90 and the thickness should be λ/4= 0.265 µm. Thus, the deposition rate for both TiO$_2$ and MgF$_2$ should be 0.2 nm/s to achieve the desired composition. For this condition, the composition of the composite film contains 59% molar fraction of TiO$_2$. FIG. 5 shows the spectral reflectance curve of a Si wafer coated with a single layer AR coating as compared with that of a Si wafer without an AR coating. The figure shows that the reflectance at λ=1.06 μm drops from 32% to less than 0.2%, indicating the improvement of transmittance due to the single-layer composite $TiO_2$—$MgF_2$ film.

Figure 6:
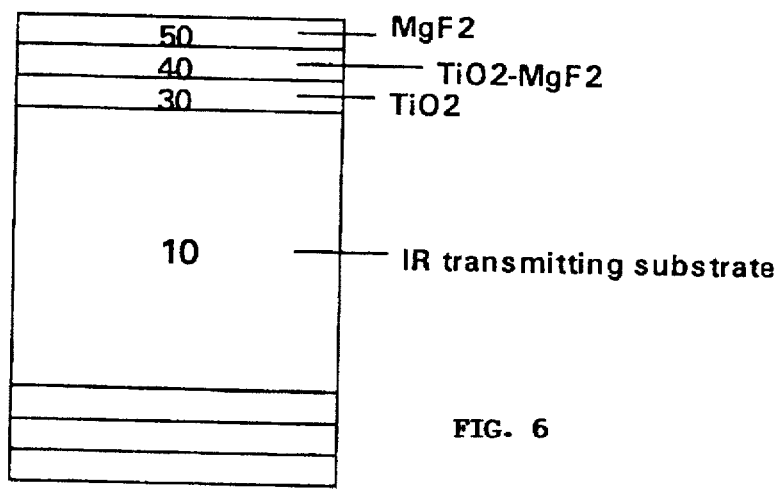
FIG. 6 shows the cross-section view of a triple-layer AR coating on an IR transparent substrate.
Figure 7:
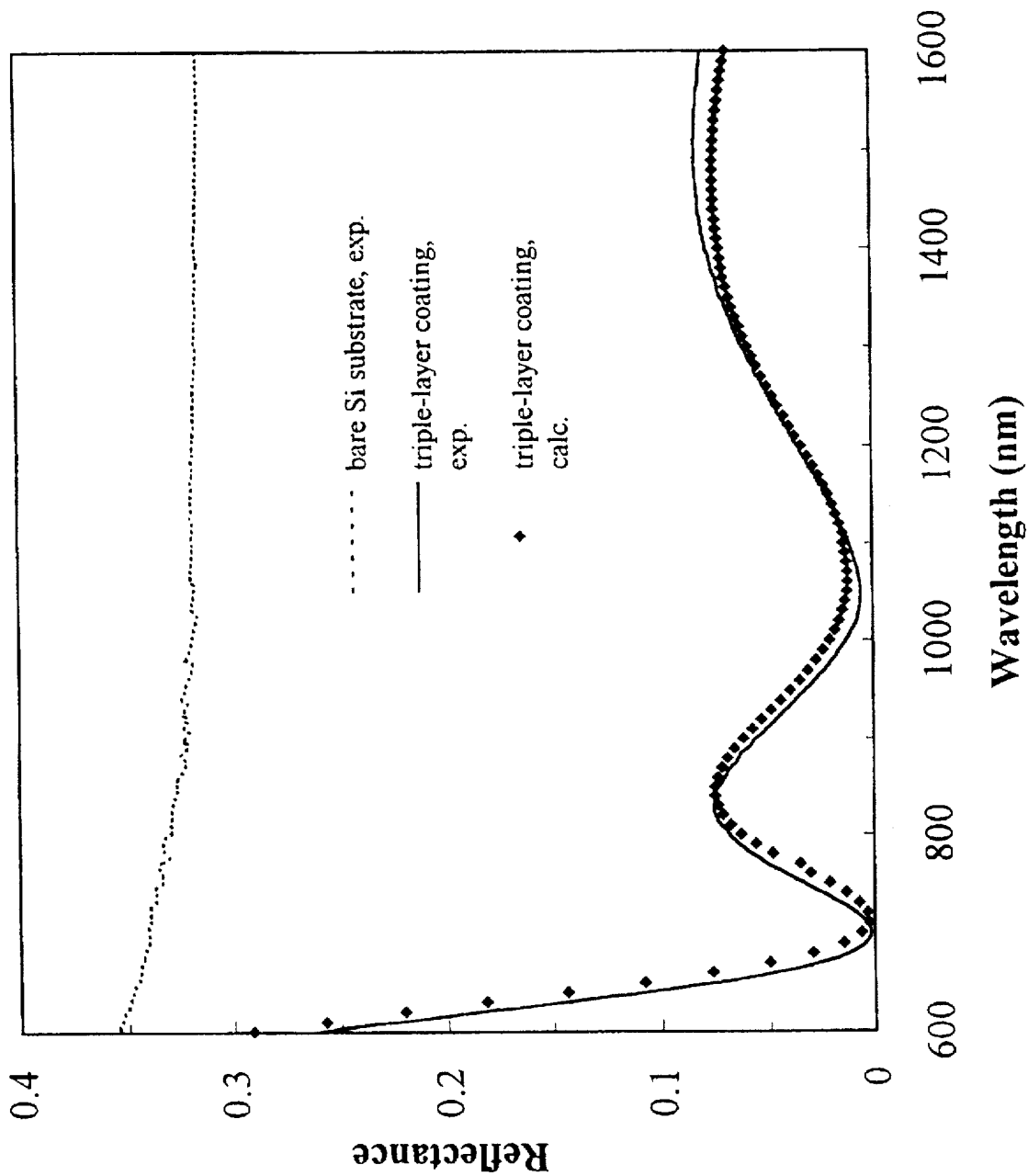
FIG. 7 shows the measured and calculated spectral reflectance curves of a Si wafer coated and not coated with a triple-layer AR coating. The thickness of every layer is equal to one quarter of wavelength 1.06 µm.

The composite $TiO_2$—$MgF_2$ films prepared by reactive IAD can not only be used for single-layer AR coatings, but the composition can also be adjusted to fabricate multilayer AR coatings or optical filters. For example, it is known that pure $TiO_2$ and $MgF_2$ cannot be stacked alternately to form an optical coating, because both materials have very high tensile stresses. However, a layer of composite $MgF_2$—$TiO_2$ film can be sandwiched between a $TiO_2$ film and a $MgF_2$ film to form a triple-layer AR coating over a Si substrate as shown in FIG. 6. In this structure, the layer 30 next to the Si substrate 20 is $TiO_2$ ($n_1$=2.1 at λ=1.06 μm), the sandwiched layer 40 is the composite $TiO_2$—$MgF_2$ ($n_1$=1.8, 1.06μm), and the outermost layer 50 is $MgF_2$ ($n_1$=1.37, λ=1.06μm). The thickness of every layer is λ/4=0.265μm. The sandwiched layer is deposited with a rate of 0.2 and 0.25 nm/S respectively for $TiO_2$ and $MgF_2$, and has approximately 50% molar fraction of $TiO_2$. FIG. 7 shows the spectral reflectance curve of the triple-layer AR coating on a Si wafer as compared with a bare Si substrate. The figure exhibits a W-shaped reflectance curve as compared with that of a v-shaped curve for a single-layer AR coating. The spectral region with low reflectance of W-shaped curve is wider than the V-shaped curve. However, the minimum reflectance of 0.6% at a wavelength of 1.06 μm for the triple-layer AR coating is higher than the 0.2% reflectance for single-layer AR coating. FIG. 7 also shows that the measured reflectance agrees very well with theoretical calculation, proving the reliability of the composite $TiO_2$—$MgF_2$ film prepared by reactive IAD.

Figure 8:
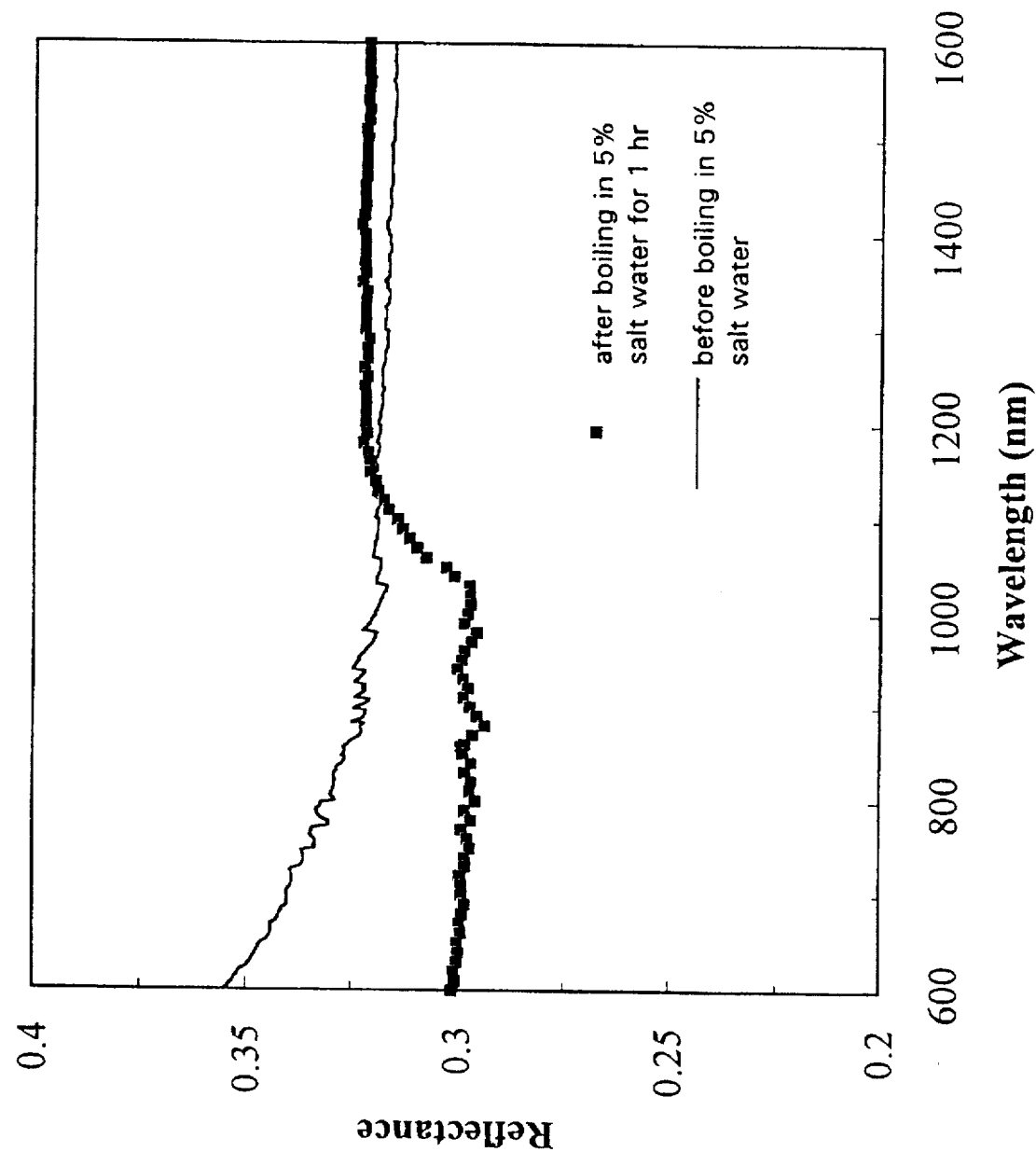
FIG. 8 shows the spectral reflectance curve of a Si wafer before and after boiling in 5 wt % salt water for one hour.
Figure 9:
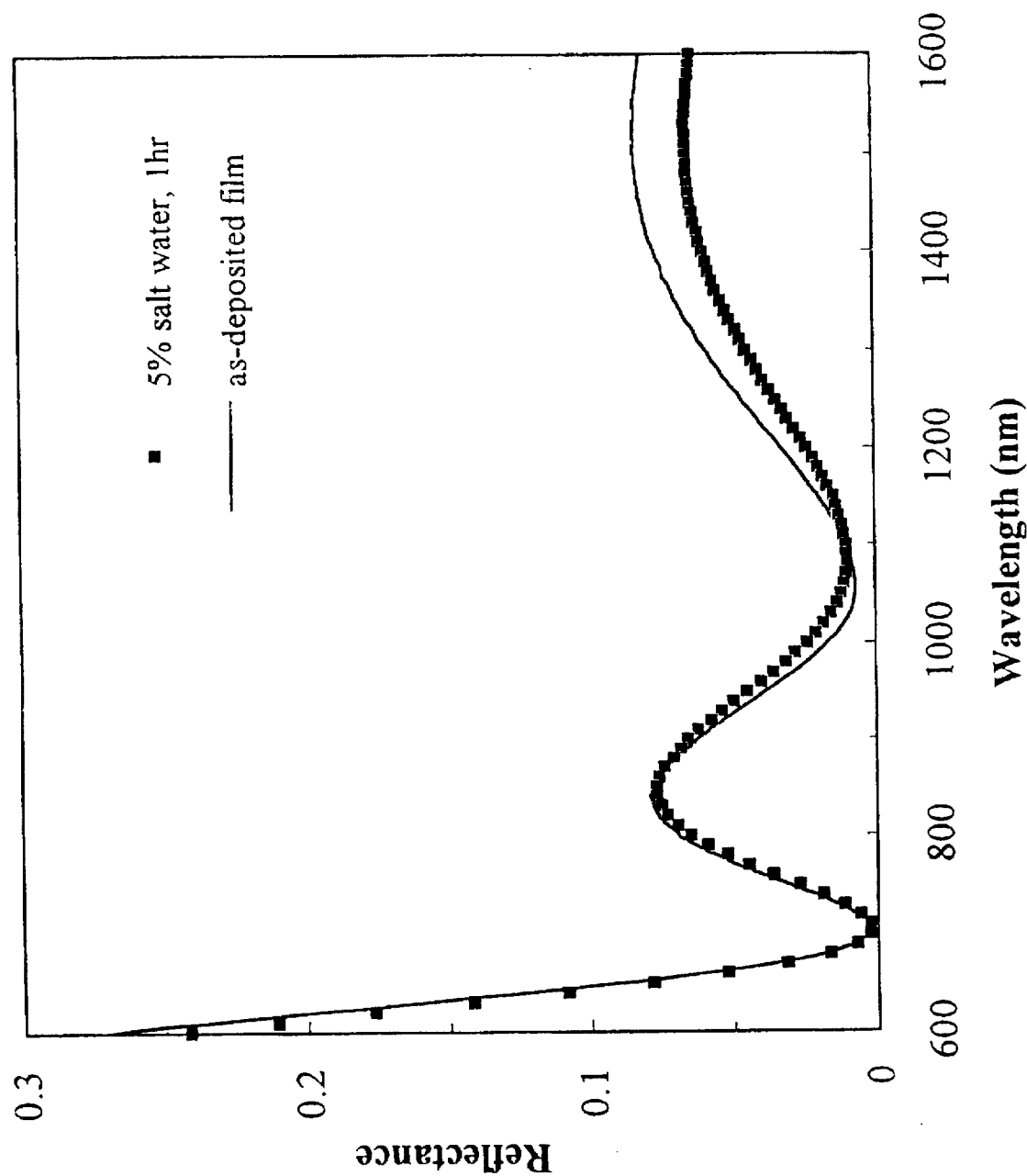
FIG. 9 shows the reflectance spectra of a Si wafer coated with a triple-layer AR coating before and after boiling in 5% 5 wt % salt water for 1 hour.

The durability of IR optical devices under adverse ambient conditions is an important requirement, especially for military applications where these devices must be able to withstand high temperature, high humidity and salt erosion. Without durability, the film may become mildewed or peel off. For the purpose of tesing the durability of the composite $TiO_2$—$MgF_2$ film, the Si wafers with and without the triple-layer AR coating as depicted in FIG. 6 are boiled in 5 wt % salt water for one hour, washed in deionized water several times to remove any salt water residue, and then blown dry with nitrogen. FIG. 8 shows the spectral reflectance curves of a bare Si wafer before and after 5 wt % salt water for one hour boiling. The reflectance after salt water boiling decreases markedly below 1.0–1.1 μm in wavelength and is different from the reflectance of the Si wafer without salt water boiling. On the other hand, the spectral reflectance curves of a Si wafer with a triple-layer coating is shown in FIG. 9. There is little difference before and after salt water boiling. The results shown in FIG. 8 and FIG. 9 prove that the composite $TiO_2$—$MgF_2$ film prepared by reactive IAD is very durable. The composite $TiO_2$—$MgF_2$ films prepared by reactive IAD as AR coatings on high refractive-index IR transparent substrate has many significant advantages over traditional materials:

1. Variable Applications: Due to the adjustable optical property, the refractive-indices can vary from 1.37 to 2.1 at λ=1.06 μm. The material is suitable for fabricating AR coating on IR transparent devices where the refractive indices are in the range of 1.88–4.41.

2. Effective Use of Spectrum: The composite $TiO_2$—$MgF_2$ films have useful transmitting range from 0.4 to 8 μm.

3. Improved Signal-to-Noise Ratio: The composite $TiO_2$—$MgF_2$ film as a single-layer AR coating on Si wafer can greatly reduce the surface reflectance from 32% down to 0.2% at the desired wavelength.

4. Durability: The composite $TiO_2$—$MgF_2$ films are very hard and durable, and can be used as an effective protecting material.

While the foregoing description depicts a single-layer AR coating and a triple-layer AR coating, it should be noted that the coating is not limited to only three layers. Any multiple layers AR coatings using the composite $TiO_2$—$MgF_2$ films are all within the scope of this invention.

What is claimed is:

1. An infrared (IR) transparent window comprising a substrate which has a refractive-index in the range of 1.88 and 4.41 at a wavelength of 1.06 um and is transmissive to infrared irradiation incident from a medium with a refractive-index $n_m$ different from the refractive-index of said substrate $n_s$, comprising at least one layer interference coating which is deposited onto said substrate wherein the thickness of each said layer is one quarter of the wavelength of the IR irradiation, at least one layer of said coating is composed of a composite of titanium oxide ($TiO_2$) and magnesium fluoride ($MgF_2$), which:

is transparent to IR irradiation in the wavelength range of 0.4 to 8 um and has a refractive-index $n_f$ less than 2.1 and greater than 1.37 at a wavelength of 1.06 um, and is prepared by low temperature ion-assisted coevaporation.

2. An infrared (IR) transparent window as described in claim 1, wherein said substrate is a silicon wafer.

3. An infrared (IR) transparent window as described in claim 1, wherein said coating is a single-layered coating.

4. An infrared (IR) transparent window as described in claim 3, wherein said single-layered coating fulfills the requirement: $n_f=(n_s X n_m)^{1/2}$, and to have a thickness equal to one quarter of the wavelength of any said IR irradiation.

5. An infrared (IR) transparent window as described in claim 1, wherein said coating is a three-layered coating with said $TiO_2$—$MgF_2$ composite film sandwiched between a layer of $TiO_2$ and a layer of $MgF_2$.

6. An infrared (IR) transparent window as described in claim 5, wherein each said layer has a thickness equal to one quarter wavelength of said IR irradiation.

7. An infrared (IR) transparent window as described in claim 1, wherein said coating has a multilayer of $TiO_2$, $MgF_2$, and $TiO_2Mg_2$.

8. An infrared (IR) transparent window as described in claim 1, wherein the molar fraction of the $TiO_2$ is adjusted in the ranged less than 58.3% and more than 93.3%.

* * * * *